United States Patent
Hales et al.

(10) Patent No.: US 7,436,338 B2
(45) Date of Patent: Oct. 14, 2008

(54) CURRENT MODE SIGMA-DELTA MODULATOR

(75) Inventors: Rex K. Hales, Riverton, UT (US); Kent Smith, Holladay, UT (US)

(73) Assignee: SLICEX, Inc., Draper, UT (US)

(*) Notice: Subject to any disclaimer, the term of this patent is extended or adjusted under 35 U.S.C. 154(b) by 0 days.

(21) Appl. No.: 11/643,212

(22) Filed: Dec. 21, 2006

(65) Prior Publication Data

US 2007/0139241 A1    Jun. 21, 2007

Related U.S. Application Data

(60) Provisional application No. 60/753,227, filed on Dec. 21, 2005, provisional application No. 60/753,279, filed on Dec. 21, 2005, provisional application No. 60/753,280, filed on Dec. 21, 2005.

(51) Int. Cl.
    *H03M 3/00* (2006.01)
(52) U.S. Cl. ........................ 341/143; 341/155
(58) Field of Classification Search ......... 341/143–155
    See application file for complete search history.

(56) References Cited

U.S. PATENT DOCUMENTS

| | | | |
|---|---|---|---|
| 5,530,442 A * | 6/1996 | Norsworthy et al. | 341/131 |
| 5,754,131 A * | 5/1998 | Ribner et al. | 341/143 |
| 6,426,714 B1 | 7/2002 | Ruha et al. | |
| 6,473,019 B1 * | 10/2002 | Ruha et al. | 341/143 |
| 6,778,119 B2 * | 8/2004 | May | 341/144 |
| 7,057,540 B2 * | 6/2006 | Muhammad et al. | 341/143 |
| 7,081,845 B2 | 7/2006 | Hales et al. | |
| 7,098,828 B2 * | 8/2006 | San et al. | 341/143 |
| 2003/0080888 A1 * | 5/2003 | Muhammad et al. | 341/143 |
| 2005/0285766 A1 * | 12/2005 | San et al. | 341/143 |

* cited by examiner

*Primary Examiner*—Lam T Mai
(74) *Attorney, Agent, or Firm*—Steven L. Nichols; Rader, Fishman & Grauer PLLC

(57) ABSTRACT

Exemplary sigma-delta modulators include a summing block configured to receive an input signal, a noise shaping unit configured to process an output signal of the summing block, a quantizer configured to quantize an output signal of the noise shaping unit, and a current-mode digital-to-analog converter ("DAC") configured to convert an output of the quantizer into an analog signal and input the analog signal into the summing block in a closed loop feedback manner.

19 Claims, 11 Drawing Sheets

CURRENT MODE SIGMA-DELTA MODULATOR

RELATED APPLICATIONS

The present application claims priority under 35 U.S.C. § 119(e) to U.S. Provisional Patent Application No. 60/753,227, by Rex K. Hales et al., filed on Dec. 21, 2005, and entitled "CURRENT MODE DIGITAL TO ANALOG CONVERTER IN SIGMA-DELTA MODULATOR"; U.S. Provisional Patent Application No. 60/753,279, by Rex K. Hales, filed on Dec. 21, 2005, and entitled "METHODS AND SYSTEMS FOR CONTROLLING IDLE TONES OF A SIGMA-DELTA MODULATOR"; and U.S. Provisional Patent Application No. 60/753,280, by Rex K. Hales, filed on Dec. 21, 2005, and entitled "CONTROLLING AN OVERLOAD CONDITION IN A SIGMA-DELTA MODULATOR". The contents of each of these applications are hereby incorporated by reference in their respective entireties.

BACKGROUND

Conventional high-resolution analog-to-digital converters ("ADCs"), such as successive approximation and flash type converters, often do not make use of exceptionally high speeds achieved with a scaled VLSI technology. Many of these ADCs operate at the Nyquist rate (i.e., at a sampling frequency approximately equal to twice the maximum frequency in the input signal). Hence, they often require a complicated analog lowpass filter (often called an anti-aliasing filter) to limit the maximum frequency input to the ADC, and sample-and-hold circuitry.

Moreover, the performance of digital signal processing and communication systems in general is limited by the precision of the digital input signal which is achieved at the interface between analog and digital information.

Hence, sigma-delta analog-to-digital converters ("ADCs") and digital-to-analog converters ("DACs"), generally referred to herein as sigma-delta modulators, are used in many applications wherein analog signals are to be converted to digital signals and vice versa. Sigma-delta modulators are often a cost effective alternative for many types of converters (e.g., high resolution converters) which can be ultimately integrated on digital signal processor ICs.

Sigma-delta modulators use a low resolution ADC (e.g., a 1-bit quantizer), noise shaping, and a very high oversampling rate. This high resolution can be achieved by a decimation (sample-rate reduction) process. Additional advantages of sigma-delta modulators include higher reliability, increased functionality, and reduced chip cost.

SUMMARY

Exemplary sigma-delta modulators include a summing block configured to receive an input signal, a noise shaping unit configured to process an output signal of the summing block, a quantizer configured to quantize an output signal of the noise shaping unit, and a current-mode digital-to-analog converter ("DAC") configured to convert an output of the quantizer into an analog signal and input the analog signal into the summing block in a closed loop feedback manner.

BRIEF DESCRIPTION OF THE DRAWINGS

The accompanying drawings illustrate various embodiments of the principles described herein and are a part of the specification. The illustrated embodiments are merely examples and do not limit the scope of the disclosure.

Throughout the drawings, identical reference numbers designate similar, but not necessarily identical, elements.

DETAILED DESCRIPTION

Current-mode sigma-delta modulators are described herein. In some examples, a current-mode sigma-delta modulator includes a summing block configured to receive an input signal, a noise shaping unit configured to process an output signal of the summing block, a quantizer configured to quantize an output signal of the noise shaping unit, and a current-mode digital-to-analog converter ("DAC") configured to convert an output of the quantizer into an analog signal and input the analog signal into the summing block in a closed loop feedback manner.

In the following description, for purposes of explanation, numerous specific details are set forth in order to provide a thorough understanding of the present systems and methods. It will be apparent, however, to one skilled in the art that the present systems and methods may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Figure 1:
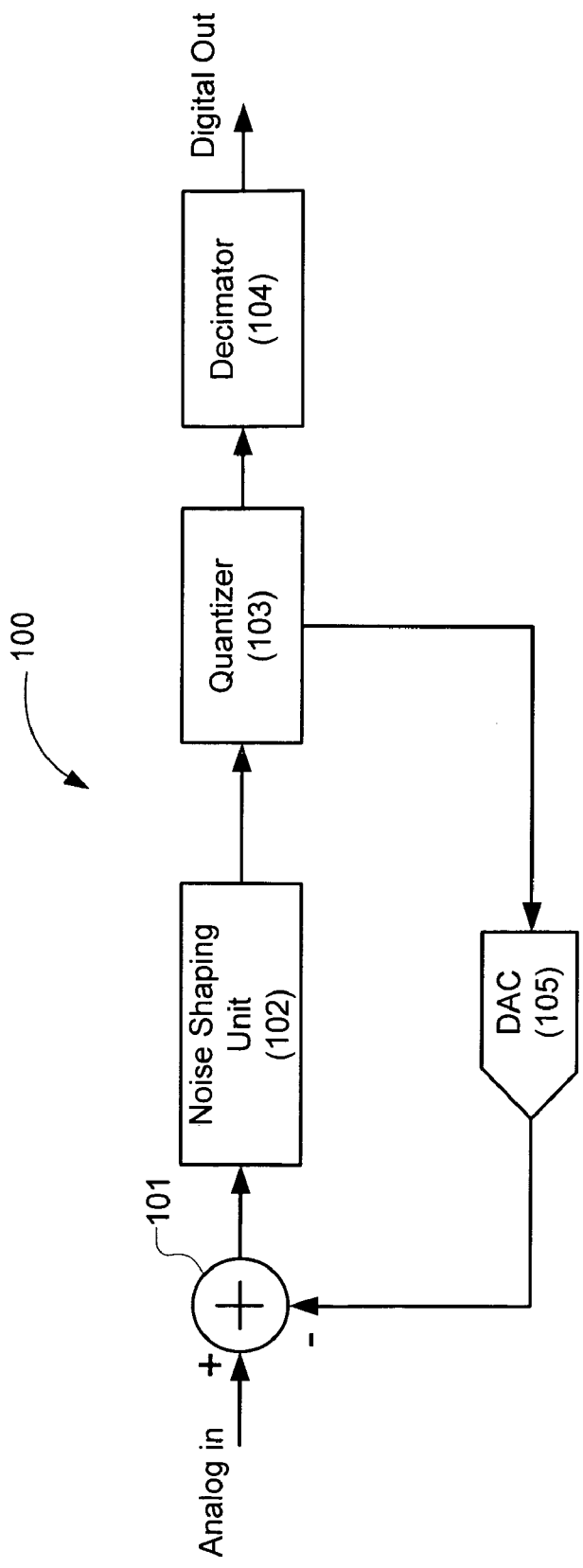
FIG. 1 illustrates an exemplary single loop sigma-delta modulator according to principles described herein.

FIG. 1 illustrates an exemplary N-order single loop sigma-delta modulator 100. It will be recognized that the sigma-delta modulator 100 shown in FIG. 1 is merely exemplary of the many different configurations of sigma-delta modulators that may be used in connection with the systems and methods described herein. For example, in some alternative examples, the sigma-delta modulator 100 may include multiple stages (i.e., multiple-order modulators). Moreover, it will be recognized that the sigma-delta modulator 100 may also be referred to as a delta-sigma modulator.

In general, sigma-delta modulator 100 is configured to make rough evaluations of an input signal, measure the error of these evaluations, integrate the error, and then compensate for the error. The mean output value is then equal to the mean input value if the integral of the error is finite.

Sigma-delta modulator 100 may include a summing block 101, a noise shaping unit 102, a quantizer 103, a decimator 104, and a DAC 105. Each of these components will be described in more detail below.

As shown in FIG. 1, an input signal is first summed at the summing block 101 with the output of the feedback DAC 105. In some examples, the summing may be accomplished by means of a switched capacitor circuit which accumulates charge onto a capacitor summing node. It will be recognized that the summing block 101 may be configured to sum the input signal and the output of the feedback DAC 105 using any other combination of circuitry.

The summed signal is then input into the noise shaping unit 102. In some examples, the noise shaping unit 102 includes an integrator. The noise shaping unit 102 is configured to add the output of the summing block 101 to a value that it has stored from a previous integration step.

The output of the noise shaping unit 102 is then input into a quantizer 103. Quantizer 103 is configured to quantize the output of the noise shaping unit 102. For example, the quantizer 103 may include a comparator that outputs a logic 1 if the output of the noise shaping unit 102 is greater than or equal to a reference voltage and a logic 0 otherwise. It will be recognized that the quantizer 103 may include additional or alternative components as best serves a particular application.

The output of the quantizer 103 may then be input into the DAC 105, which converts the digital signal back into an analog signal. The output of the DAC 105 is input into the summing block 101 in a closed loop manner, described previously.

The output of the quantizer 103 may also be input into a decimator 104. The decimator 104 may include a digital filter, for example, and may be configured to filter the stream of 1's and 0's output by the quantizer 103. In this manner, a stream of multi-bit samples may be output by the modulator 100.

The sigma-delta modulator loop typically runs at a much higher frequency (i.e., oversampling) than the final output rate of the decimator 104. For example, a modulator 100 with a 2 kHz output data rate may have a loop frequency of over 2.5 MHz. It will be recognized that the output frequency and the loop frequency of the sigma-delta modulator 100 may vary as best serves a particular application.

In many typical sigma-delta modulators 100, each of the components are designed in terms of voltage. For example, as will be described in more detail below, the DAC 105 may be configured as a voltage mode DAC 105.

Over the years, integrated circuits have seen incredible increases in density. With each reduction in feature size, there has also been a reduction in optimal operating voltage. These decreases in operating voltage have required reductions in threshold voltages in an attempt to maintain noise margins. Analog circuits, particularly ADCs and DACs have suffered from this reduction, and are typically designed with higher voltage transistors and operating voltages than are available to digital designers.

In a typical voltage mode ADC or DAC, the voltage being sampled is stored on a capacitor. It can be shown that the minimum size of the capacitor storing the voltage must be greater than $kT/(Vn^2)$, where k is Boltzman's constant, T is temperature in Kelvin, and Vn is the size of the largest noise signal, usually less than ¼ of the ADC's least significant bit (LSB), that can be tolerated to give a low probability of error. As the operating voltage is reduced due to newer processes, the minimum capacitor size increases. This increases both the size of the circuit and the power used.

The accuracy of a voltage mode circuit, including a voltage mode ADC or DAC, is determined by the size of the capacitance used to store the voltage. The speed of a voltage mode circuit is consequently affected by circuit capacitance and parasitic capacitance. The nodes of a voltage mode circuit must change voltage during operation of the circuit over a range that is often approximately the entire voltage range of the power supply voltage. Changing the voltage requires that the circuit and parasitic capacitances must charge and discharge. Smaller integrated circuit geometries have been able to reduce circuit capacitance, at the cost of smaller supply voltages, which has a negative impact on noise margins.

However, there are several advantages to designing circuits in terms of current. As will be described in more detail below, an input current may be compared to a set of current references to determine which reference current is closest to the input current. A digital representation of the input signal may then be created based on a series of such current comparisons.

One of the many values of this approach is that, since current sources are used rather than voltage references, operational voltage becomes far less important. By allowing lower operating voltages to be used, the ADC can take better advantage of the increases in modern integrated circuit density. Also, since the voltages at nodes in a current mode circuit change very little, circuit and parasitic capacitances have much less effect on the speed of the circuit.

Hence, in some examples, the DAC 105 is configured to be a current mode DAC. Current mode DAC 105 may also be referred to as a current steering DAC and/or as a current source DAC. However, for explanatory purposes, DAC 105 will be referred to herein as a current mode DAC.

Figure 2:
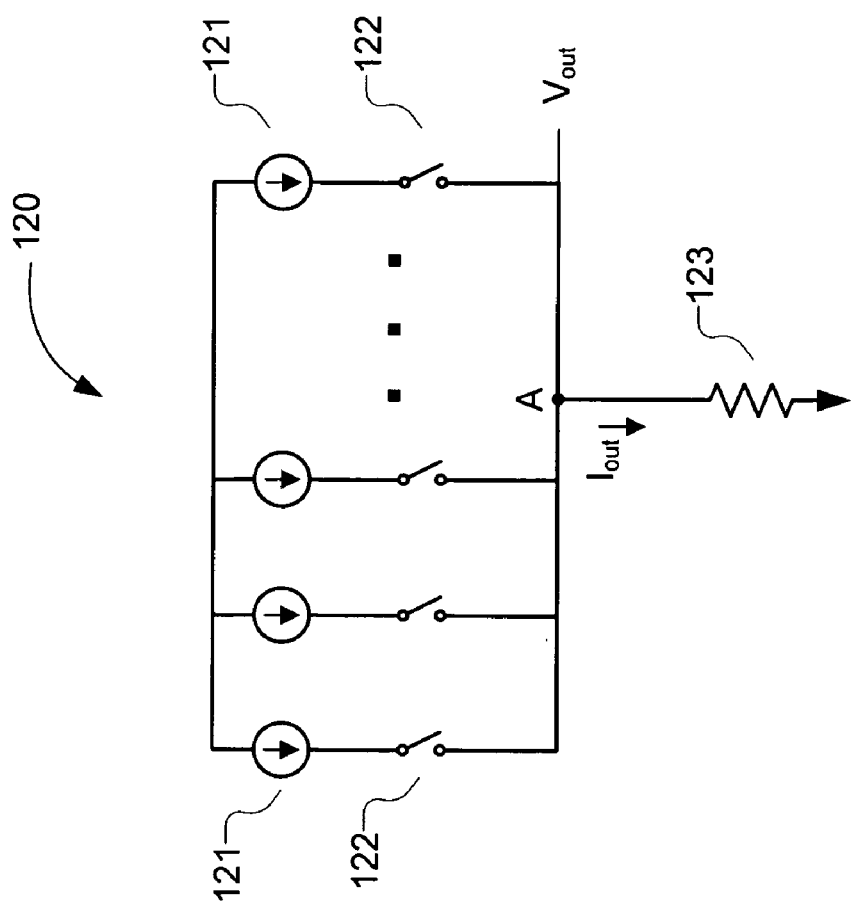
FIG. 2 illustrates an exemplary current mode digital-to-analog converter ("DAC") according to principles described herein.

FIG. 2 illustrates an exemplary current mode DAC 120 that may be used as the DAC 105. As shown in FIG. 2, the current mode DAC 120 may include a plurality of current sources 121 each coupled to a corresponding switch 122. In some examples, $2^n$ current sources 121 (where n is the number of desired bits of resolution) are provided. In some alternative examples, one or more of the current sources 121 may be weighted in some manner (e.g., binary weighting) so that the total number of current sources 121 is less than $2^n$. The current sources 121 will be described in more detail below.

As shown in FIG. 2, each switch 122 is coupled at a single node A. In this manner, each current source 121 may be selectively included to generate a desired output current $I_{out}$. In cases where an output voltage $V_{out}$ is desired, resistor 123 may be connected to node A. In some examples, the current source 121 may be made differential by adding an additional switch that connects to the current source that steers the current to another output.

Figure 3:
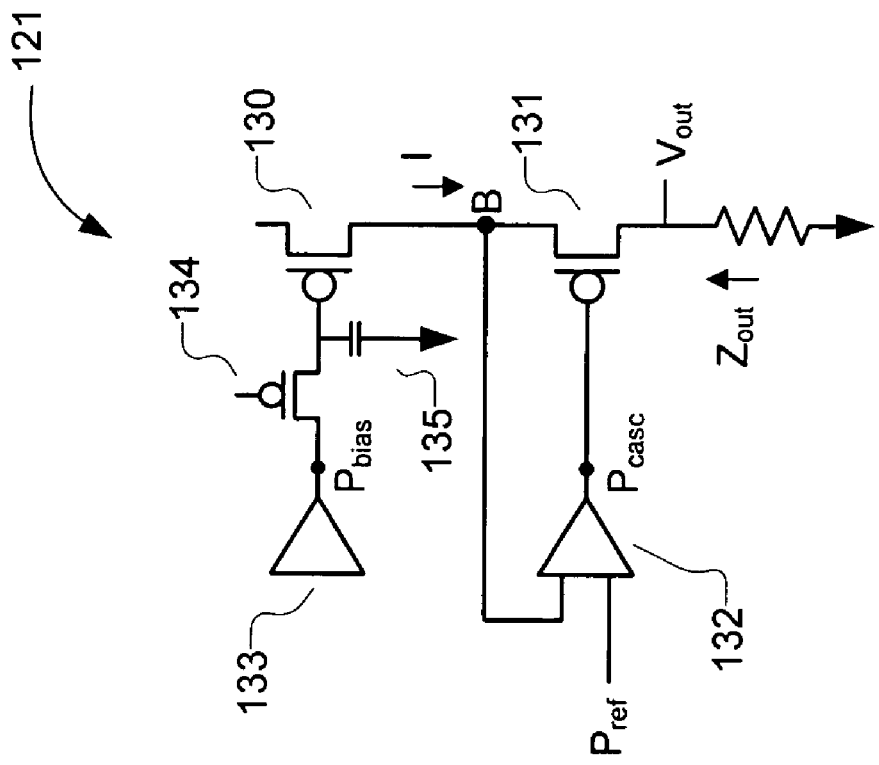
FIG. 3 illustrates an exemplary configuration of a current source that may be used within a current mode DAC according to principles described herein.

It will be recognized that each current source 121 may include any suitable combination of circuitry. For example, FIG. 3 illustrates an exemplary configuration of a current source 121. The current source 121 shown in FIG. 3 includes a bias transistor 130 and a cascode transistor 131. Hence, the current source 121 may be referred to as a cascode current source.

As shown in FIG. 3, current I may be configured to flow in the direction through the bias transistor 130 down through the cascode transistor 131. The nodes labeled $P_{bias}$ and $P_{casc}$ represent bias voltages that may be set to generate the current I that flows through the current source 121.

In some examples, the current source 121 may also include first and second op-amps 132 and 133. As will be described in more detail below, op-amp 132 is configured to ensure that the current I remains constant over a voltage range of interest. Op-amp 133 is configured to calibrate the current source 121. Switch 134 may also be included within the circuit to switch in op-amp 133. Capacitor 135 may also be included within the circuit to hold a calibration value when op-amp 133 is not switched in.

As mentioned, op-amp 132 may be used to ensure that the current I remains constant. Because the constancy of the current I over the output voltage $V_{out}$ swing is dependent on the output impedance $Z_{out}$ looking into the circuit as shown in FIG. 3. With op-amp 132 in a configuration as shown in FIG. 3 (i.e., with a reference input signal $P_{ref}$ feedback input from the node labeled "B", and its output connected to node $P_{casc}$), the output impedance $Z_{out}$ is much higher than in non-cascode arrangements. As the output voltage $V_{out}$ changes, the voltage at node B normally also changes. However, op-amp 132 forces a change in the $P_{casc}$ voltage to compensate for the change in voltage at node B, forcing the node voltage at node B to remain the same. This, in turn, forces the output impedance $Z_{out}$ to become essentially infinite. In this manner, the current I remains constant over the output voltage $V_{out}$ swing.

Figure 4:
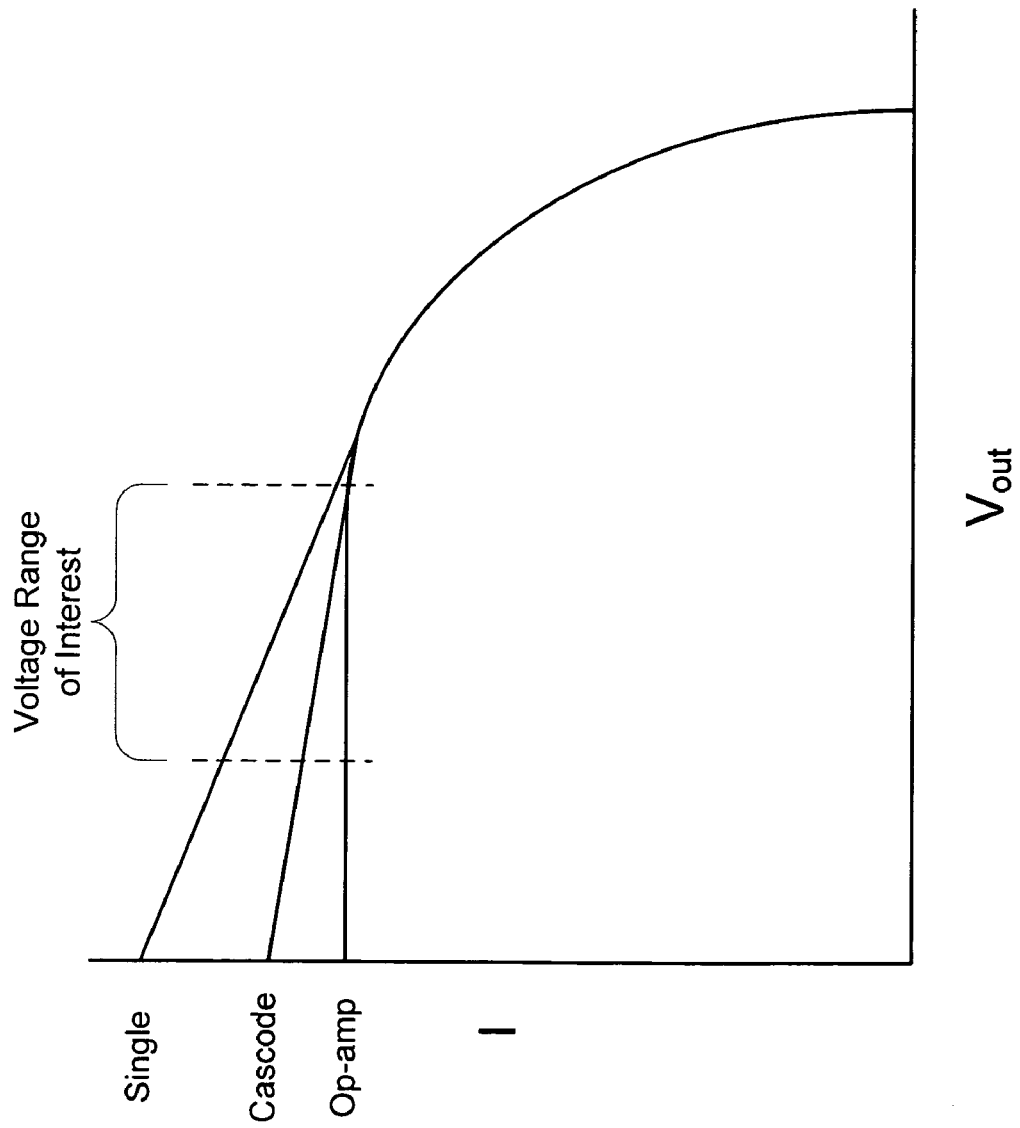
FIG. 4 illustrates a number of output voltage to current curves according to principles described herein.

To illustrate the effect of adding the op-amp 132, a number of output voltage $V_{out}$ to current I curves are illustrated in FIG. 4. As shown in FIG. 4, a normal output voltage $V_{out}$ to current I curve (i.e., when a single transistor is used within the current source 121) is labeled as "single." The voltage range of interest is shown between the two vertical lines drawn through the curves. With a cascode arrangement minus the op-amp 132, the output voltage $V_{out}$ to current I curve is a little flatter, as indicated by the curve labeled "cascode."

However, with the op-amp 132 included, the output voltage $V_{out}$ to current I curve is substantially flat through the voltage range of interest, as indicated by the curve labeled "op-amp".

Returning to FIG. 3, op-amp 133 may be used to calibrate the current source 121. In dynamic calibration, op-amp 133 is used to make a comparison against a single current source and dynamically calibrate each of the other current sources 121 within the current mode DAC 120. A switch may be provided that switches the current source into the feedback loop of this op-amp so that it accurately sets the current in this current source to be the same as the reference current source. The current source may then be switched out of the feedback loop.

Figure 5:
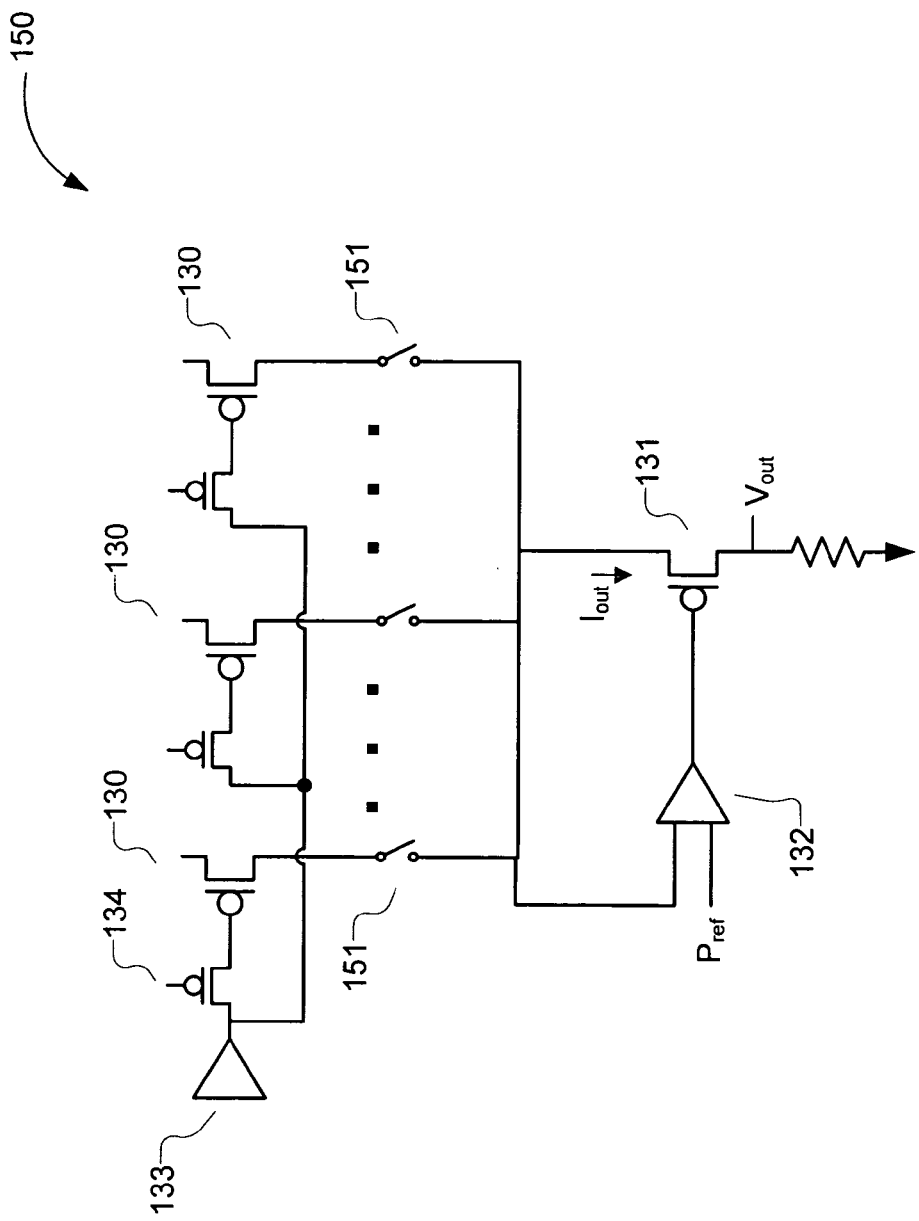
FIG. 5 illustrates another exemplary current mode DAC implementing the cascode current source configuration shown in FIG. 3 according to principles described herein.

FIG. 5 illustrates another exemplary current mode DAC 150 implementing the cascode current source configuration shown in FIG. 3. As shown in FIG. 5, each current source includes a bias transistor 130 coupled to the op-amp 133. By placing switches 151 after each bias transistor 130, a single cascode transistor 131 and op-amp 132 may be used to maintain a constant current $I_{out}$, thus saving space and energy.

In some examples, dynamic element matching (DEM) may also be used in the current mode DACs described herein. DEM changes which current sources are used to generate the output for a particular digital input to average out differences in the current source values over time. This can be done by randomly selecting which current sources are used, or by using a mathematical algorithm. Returning to FIG. 3, the calibration of $P_{bias}$ sets the current to be accurate to within the gain (e.g., 100 dB) of the op-amp 133. Dynamic element matching allows the theoretical best performance of the current source DAC to be higher than it normally would be (e.g., greater than 100 dB.)

In some examples, any of the other components included within the sigma-delta modulator 100 may be configured to be current mode components. For example, the quantizer 103 may include one or more current mode ADCs. Each current mode ADC may be configured to have any number of bits of resolution as best serves a particular application.

Figure 6:
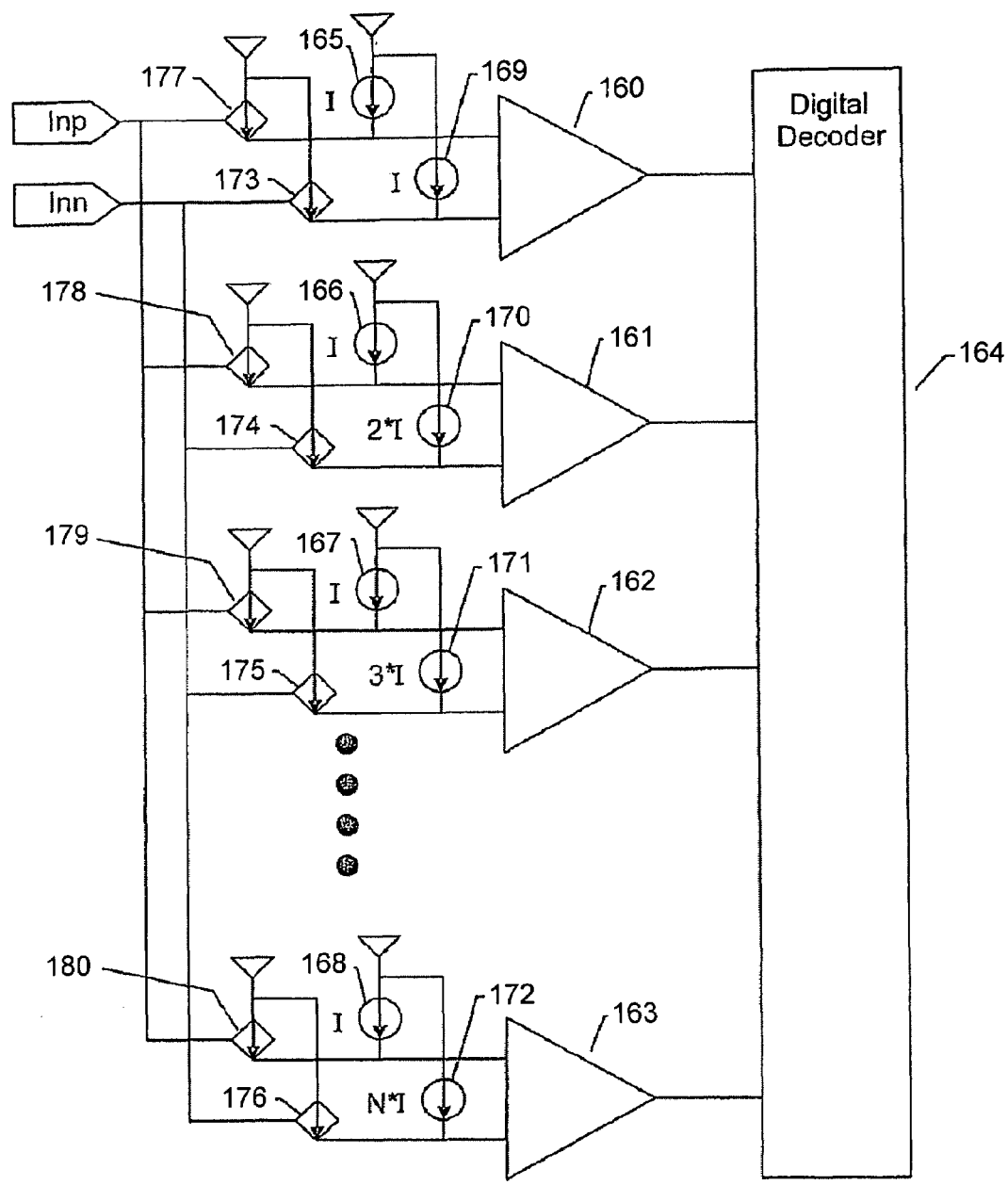
FIG. 6 shows an exemplary n-bit current mode analog-to-digital converter ("ADC") that may be used within the quantizer or within any other component of the sigma-delta modulator according to principles described herein.

FIG. 6 shows an exemplary n-bit current mode ADC that may be used within the quantizer 103 or within any other component of the sigma-delta modulator 100. Additional details related to current mode ADCs are described more fully in U.S. Pat. No. 7,081,845, entitled "Current Mode Analog-to-Digital Converter," which patent is incorporated herein by reference in its entirety.

As shown in FIG. 6, current comparators 160-163 are connected to a digital decoder 164. The comparators 160-163 take current inputs and convert them to a digital outputs. Elements 165-168 are current sources that are configured to add a DC bias to each input signal. Elements 169-172 are current sources with output currents scaled from I to N*I, where N is equal to $2^n$. Because the inputs to the comparators 160-163 are currents, elements 173-176 and 177-180 are current controlled current sources having current equal to, or scaled versions of input currents Inp and Inn respectively, to allow for combining the currents into the comparators.

It will be recognized that any of the other components within the sigma-delta modulator 100 may be configured to function in current mode. For example, the noise shaping unit 102 may be configured to perform integration based on currents.

In many applications, e.g., audio applications, sigma-delta modulators 100 generate idle tones. These tones may be of varying length and are often caused by semi-harmonics of the sampling frequency. These idle tones are problematic because they are perceptible to the human ear.

To counteract the idle tones, the sigma-delta modulator 100 may further include one or more components configured to add random noise or "dither" to the signals processed by the feedback loop of the modulator 100. In this manner, the random noise mixes with the idle tone to produce something that is random enough (i.e., not periodic enough) such that the human ear cannot hear it.

Figure 7:
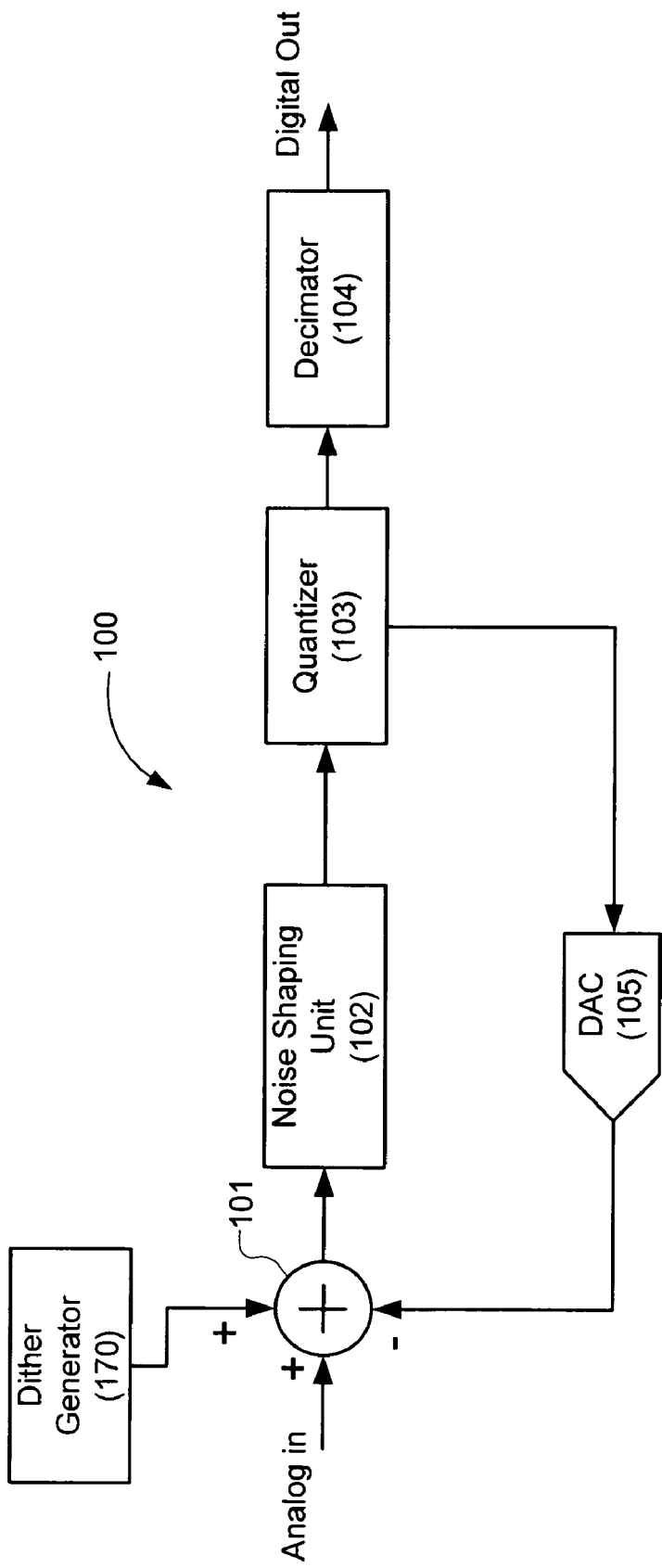
FIG. 7 shows the exemplary sigma-delta modulator with a dither generator included therein according to principles described herein.

To this end, the sigma-delta modulator 100 may further include one or more dither generators configured to add dither to the signals processed by the feedback loop thereof. For example, FIG. 7 shows the exemplary sigma-delta modulator 100 with a dither generator 170 included therein. The dither generator 170 may include any combination of components configured to generate dither. For example, the dither generator 170 may include one or more diodes that are inherently noisy. In some alternative examples, the dither generator 170 may include a pseudo-random number generator having a pattern that is not periodic enough to be detected by the human ear.

Figure 8:
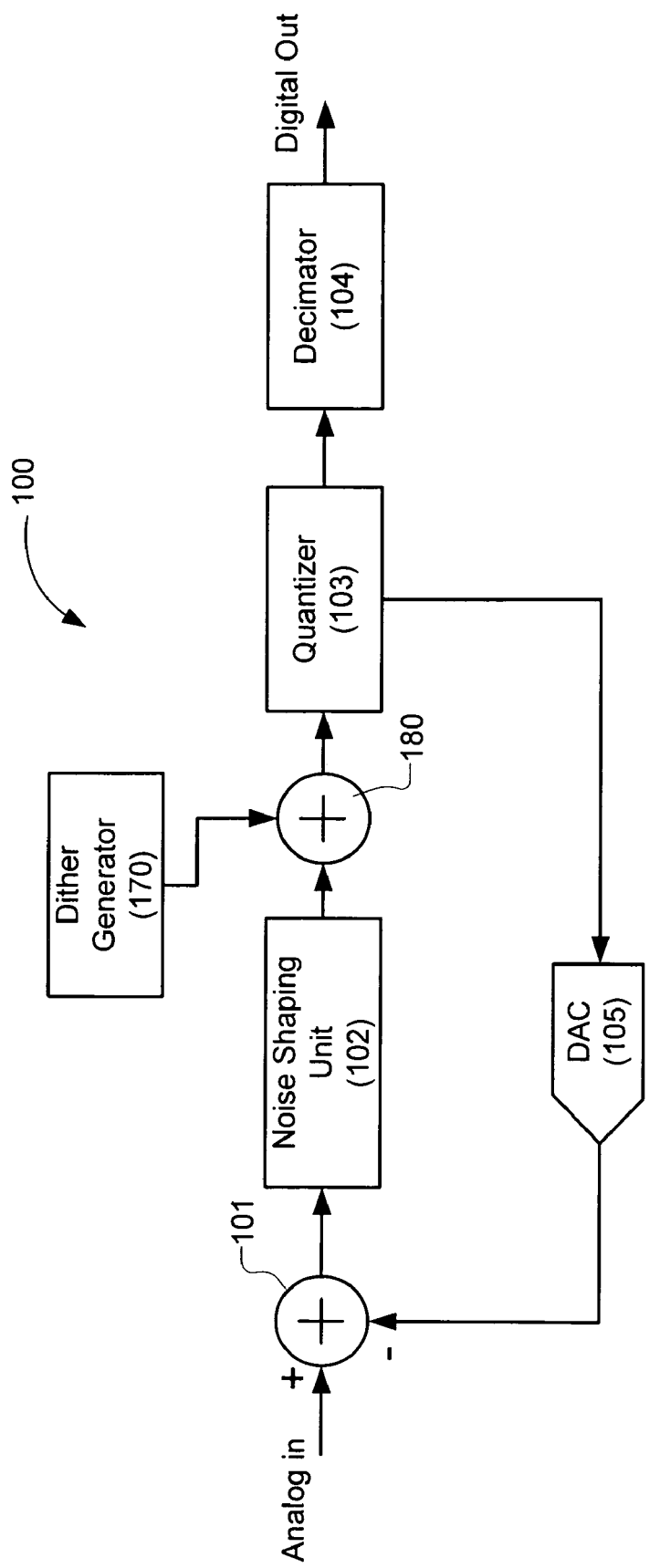
FIG. 8 shows that the dither generator may be configured to add dither to the signal after it has been processed by the noise shaping unit according to principles described herein.

As shown in FIG. 7, the dither generator 170 may be configured to add dither to the signal at the summing block 101. Alternatively, as shown in FIG. 8, the dither generator 170 may be configured to add dither to the signal after it has been processed by the noise shaping unit 102. To this end, a second summing block 180 may be inserted in between the noise shaping unit 102 and the quantizer 103. In some alternative examples, multiple dither generators 170 may be included and configured to add dither to the signal that is processed by the feedback loop at multiple locations.

Figure 9:
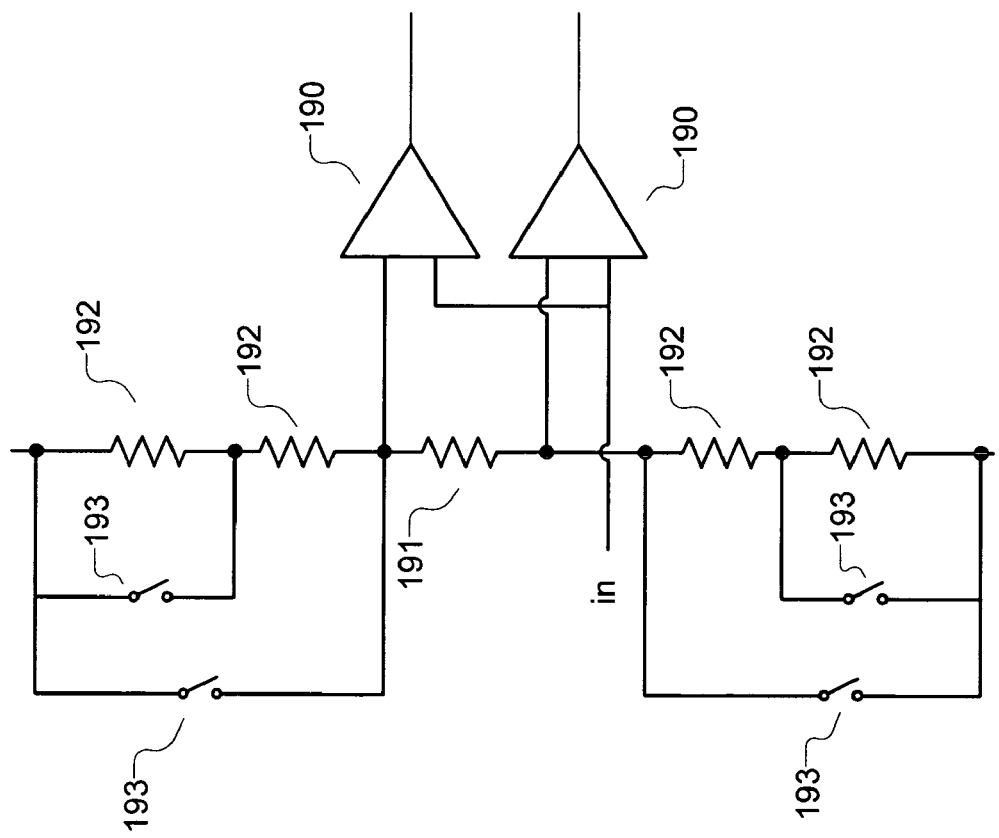
FIG. 9 shows an exemplary multi-bit quantizer according to principles described herein.

In some alternative examples, a reference signal to the quantizer 103 is dithered. For example, FIG. 9 shows an exemplary multi-bit quantizer 103. As shown in FIG. 9, the quantizer 103 includes a number of comparators 190 each with an input tied to one or more reference resistors 191 and an input connected to an input signal. The input signal is compared against signals created by the reference resistors 191 and the resulting output is a series of digital values.

FIG. 9 shows two comparators 190 for illustrative purposes. It will be recognized that any number of comparators 190 may alternatively be included.

In some examples, a number of additional resistors 192 each controlled by a switch 193 are placed in series with the reference resistors 191. In this manner, the resistors may be selectively added to the reference resistors 191. In this manner, the reference to the quantizer 103 may be dithered.

Exemplary reference signals that may be used in the dithering process include square waves, triangular waves, and/or any other type of waves as best serves a particular application.

It will be recognized that the dithering functions included herein may be alternatively be performed in current-mode. For example, in FIG. 6, dithered current references may be added to the comparator inputs in the same way that dithering the reference voltages is performed in FIG. 9.

A common problem with many sigma-delta modulators, especially high order sigma-delta modulators, is that if the input signal is too high, it will cause the sigma-delta modulator to become unstable. In other words, one or more voltages within the modulator will oscillate and go out of control.

Hence, in some examples, overload conditions corresponding to a sigma-delta modulator may be detected. The sigma-delta modulator may then recover from such an overload condition and return to normal operation. In some examples, a sigma-delta modulator may recover from an overload condition by being reset, which forces the internal voltage nodes to predetermined values.

Figure 10:
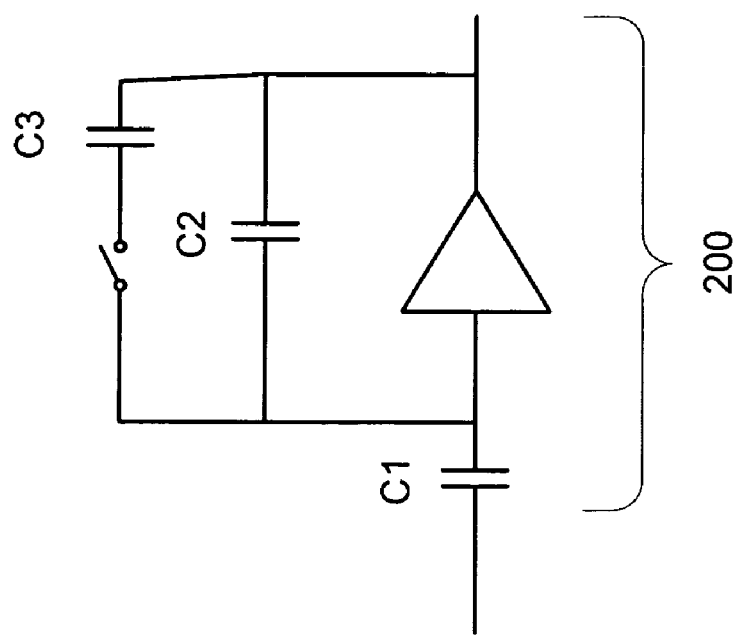
FIG. 10 illustrates an exemplary noise shaping unit according to principles described herein.

Additionally or alternatively, one or more coefficients within the noise shaping unit 102 may be adjusted in order to cause a sigma-delta modulator to recover from an overload condition. For example, FIG. 10 illustrates an exemplary noise shaping unit 102. As shown in FIG. 10, the noise shaping unit 102 may include one or more integrators 200. Each integrator 200 includes a first capacitor C1 and a second feedback capacitor C2. A coefficient is defined as the ratio of C2 to C1. It will be recognized that the components shown in FIG. 10 are single ended. However, they may alternatively be made differential.

Hence, in some examples, the coefficient for a particular integrator may be changed by including one or more additional capacitors (e.g., capacitor C3) that may be switched in and included as an additional feedback capacitor. Hence, when an overload condition is detected, a coefficient for one or more of the integrators 200 within the noise shaping unit 102 may be adjusted until the sigma-delta modulator 100 returns to a stable state. It will be recognized that currents may also be adjusted to adjust one or more of the coefficients of the integrators 200.

Figure 11:
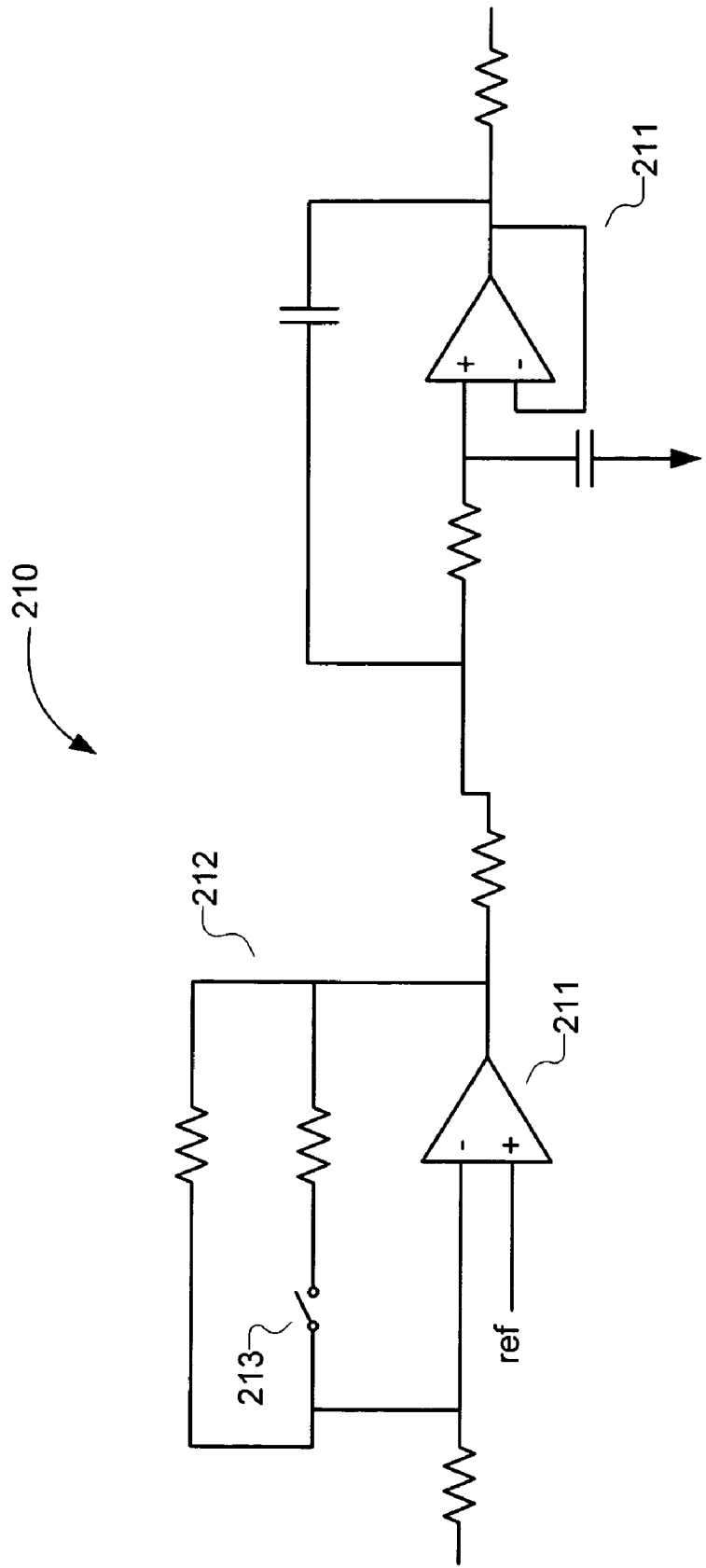
FIG. 11 illustrates various components of an exemplary anti-aliasing filter that may be used in connection with the sigma-delta modulator according to principles described herein.

Additionally or alternatively, an overload condition may be overcome by passing the input signal through an anti-aliasing filter prior before it is processed by the sigma-delta modulator 100. For example, FIG. 11 illustrates various components of an exemplary anti-aliasing filter 210 that may be used in connection with the sigma-delta modulator 100. As shown in FIG. 11, the anti-aliasing filter 210 may include a number of stages each having an op-amp 211. One or more of the stages may also have a bank of feedback resistors 212. As shown in FIG. 11, one or more of the feedback resistors may be connected in series with a switch 213. In this manner, when an overload condition is detected, the switch 213 may be closed so as to include its corresponding resistor 212 in the feedback loop and thereby adjust the gain of the filter 210. Once the overload condition has been alleviated, the switch 213 may be opened. It will be recognized that any number of switchable feedback resistors 212 may be included within the anti-aliasing filter 210 as best serves a particular application.

The preceding description has been presented only to illustrate and describe embodiments of the invention. It is not intended to be exhaustive or to limit the invention to any precise form disclosed. Many modifications and variations are possible in light of the above teaching.

What is claimed is:

1. A sigma-delta modulator comprising:
   a first summing block configured to receive an input signal;
   a noise shaping unit configured to process an output signal of said first summing block;
   a second summing block configured to sum an output from said noise shaping unit with a signal from a dither generator;
   a quantizer configured to quantize an output signal of said second summing block; and
   a digital-to-analog converter ("DAC") configured to convert an output of said quantizer into an analog signal and input said analog signal into said first summing block in a closed loop feedback manner;
   wherein said DAC comprises a current mode DAC.

2. The sigma-delta modulator of claim 1, wherein said quantizer comprises a current-mode analog-to-digital converter.

3. The sigma-delta modulator of claim 1, wherein said noise shaping unit comprises a current mode noise shaping unit.

4. The sigma-delta modulator of claim 1, further comprising a decimator communicatively coupled to said quantizer, wherein said decimator is configured to filter a digital output of said quantizer.

5. The sigma-delta modulator of claim 1, wherein said current mode DAC comprises:
   a plurality of cascode current sources; and
   an op-amp configured to maintain a constancy of an output current of said current mode DAC over a pre-determined voltage or current range. (PRIOR ART TEACHES DIFF AMP, NOT OP AMP).

6. The sigma-delta modulator of claim 1, further comprising:
   a dither generator configured to add dither to a signal processed by said sigma-delta modulator.

7. The sigma-delta modulator of claim 1, further comprising:
   an anti-aliasing filter configured to filter said input signal prior to being input into said summing block.

8. A sigma-delta modulator comprising:
   a summing block configured to receive an input signal;
   a noise shaping unit configured to process an output signal of said summing block;
   a quantizer configured to quantize an output signal of said noise shaping unit;
   a digital-to-analog converter ("DAC") configured to convert an output of said quantizer into an analog signal and input said analog signal into said summing block in a closed loop feedback manner; and
   a dither generator configured to add dither to a signal processed by said sigma-delta modulator;
   wherein said dither generator is configured to counteract one or more effects of one or more idle tones generated by said sigma-delta modulator.

9. A sigma-delta modulator comprising:
   a summing block configured to receive an input signal;
   a noise shaping unit configured to process an output signal of said summing block;
   a quantizer configured to quantize an output signal of said noise shaping unit; and a digital-to-analog converter ("DAC") configured to convert an output of said quantizer into an analog signal and input said analog signal into said summing block in a closed loop feedback manner;

wherein said quantizer comprises one or more switchable resistors, wherein said switchable resistors are configured to add dither to a reference signal for said quantizer.

10. A sigma-delta modulator comprising:

a summing block configured to receive an input signal;

a noise shaping unit configured to process an output signal of said summing block;

a quantizer configured to quantize an output signal of said noise shaping unit; and a digital-to-analog converter ("DAC") configured to convert an output of said quantizer into an analog signal and input said analog signal into said summing block in a closed loop feedback manner;

wherein said noise shaping unit comprises:

one or more integrators;

wherein one or more of said integrators comprises one or more switchable feedback capacitors; and wherein said switchable capacitors are configured to adjust one or more coefficients within said noise shaping unit such that said sigma-delta modulator recovers from an overload condition.

11. A sigma-delta modulator comprising:

a summing block configured to receive an input signal;

a noise shaping unit configured to process an output signal of said summing block;

a quantizer configured to quantize an output signal of said noise shaping unit;

a digital-to-analog converter ("DAC") configured to convert an output of said quantizer into an analog signal and input said analog signal into said summing block in a closed loop feedback manner; and an anti-aliasing filter configured to filter said input signal prior to being input into said summing block;

wherein said anti-aliasing filter comprises one or more stages each comprising an op-amp and a bank of one or more feedback resistors, and wherein said feedback resistors are configured to adjust a gain of said anti-aliasing filter to alleviate an overload condition.

12. A method comprising:

receiving an input signal at a summing block;

processing an output signal of said summing block with a noise shaping unit;

quantizing an output signal of said noise shaping unit with a quantizer;

converting an output of said quantizer into an analog signal with a current mode digital-to-analog converter ("DAC");

inputting said analog signal into said summing block to be subtracted from said input signal in a closed loop feedback manner; and adjusting one or more coefficients within said noise shaping unit such to overcome an overload condition.

13. The method of claim 12, wherein said noise shaping unit comprises a current mode noise shaping unit.

14. The method of claim 12, further comprising filtering a digital output of said quantizer.

15. The method of claim 12, further comprising maintaining a constancy of an output current of said current mode DAC over a pre-determined voltage range.

16. The method of claim 12, further comprising adding dither to a signal processed by said sigma-delta modulator to counteract one or more effects of one or more idle tones.

17. The method of claim 12, further comprising adding dither a reference signal of said quantizer to counteract one or more effects of one or more idle tones.

18. The method of claim 12, further comprising:

filtering said input signal with an anti-aliasing filter, said anti-aliasing filter comprising one or more stages each comprising an op-amp and a bank of one or more feedback resistors; and adjusting a gain of said anti-aliasing filter to alleviate an overload condition.

19. A system comprising:

means for receiving an input signal at a summing block;

means for processing an output signal of said summing block with a noise shaping unit;

means for adding a dither signal from a dither generator to an output of said noise shaping unit;

means for quantizing an output signal of said noise shaping unit plus said dither signal with a quantizer;

means for converting an output of said quantizer into an analog current; and means for inputting said analog signal into said summing block to be subtracted from said input signal in a closed loop feedback manner.

* * * * *

UNITED STATES PATENT AND TRADEMARK OFFICE
CERTIFICATE OF CORRECTION

| | | |
|---|---|---|
| PATENT NO. | : 7,436,338 B2 | Page 1 of 1 |
| APPLICATION NO. | : 11/643212 | |
| DATED | : October 14, 2008 | |
| INVENTOR(S) | : Rex K. Hales | |

It is certified that error appears in the above-identified patent and that said Letters Patent is hereby corrected as shown below:

Column 10, Line 22, Claim 17. change "dither a reference" to "dither to a reference…"

Signed and Sealed this

Ninth Day of December, 2008

JON W. DUDAS
*Director of the United States Patent and Trademark Office*